United States Patent [19]

Schuster et al.

[11] 4,107,456

[45] Aug. 15, 1978

[54] ELECTRICAL PENETRATION ASSEMBLY

[75] Inventors: Robert M. Schuster; Norman G. Luria, both of San Jose, Calif.

[73] Assignee: General Electric Company, San Jose, Calif.

[21] Appl. No.: 727,283

[22] Filed: Sep. 27, 1976

[51] Int. Cl.² .................. G21C 13/02; G21C 13/04; H01B 17/26
[52] U.S. Cl. ................. 174/151; 174/11 R; 174/18; 248/56; 285/189
[58] Field of Search .............. 174/11 R, 12 R, 18, 174/99 R, 99 E, 151; 248/55, 56; 277/12; 285/158, 189

[56] References Cited

U.S. PATENT DOCUMENTS

| | | | |
|---|---|---|---|
| 3,761,601 | 9/1973 | Kaesser et al. | 174/151 X |
| 3,781,453 | 12/1973 | Funk et al. | 174/151 X |
| 3,801,722 | 4/1974 | Korner | 174/151 X |
| 3,856,983 | 12/1974 | Fisher et al. | 174/151 |
| 3,871,689 | 3/1975 | Zaderei et al. | 174/151 X |

FOREIGN PATENT DOCUMENTS 1,046,714 12/1958 Fed. Rep. of Germany .......... 174/151
1,906,785 11/1969 Fed. Rep. of Germany .......... 285/189

*Primary Examiner*—Laramie E. Askin

*Attorney, Agent, or Firm*—Ivor J. James, Jr.; Samuel E. Turner; Sam E. Laub

[57] ABSTRACT

An electrical penetration assembly is disclosed for providing a vapor and pressure seal between a conductor passing through two freestanding walls of a nuclear reactor containment which are subject to relative movement due to a seismic event. Penetration nozzles or tubes are placed through the walls of the containment when it is constructed. The penetration assembly is inserted into the nozzles and comprises a first subassembly fixed and sealed to a first penetration nozzle in the first wall and a second penetration subassembly in sliding or rolling engagement and sealed to a second penetration nozzle in the second wall. The sliding or rolling seal in the second nozzle allows the unrestrained reaction of the conductor to relative movement between the two freestanding walls during a seismic event without damage to the conductor or the penetration assembly. The penetration assembly also prevents the possibility of damage to either the conductor or the penetration assembly due to thermally induced stresses. The penetration assembly also minimizes installation difficulties resulting from unavoidable misalignments of the walls or the penetration nozzles mounted therein. Several embodiments of the invention showing different ways of effecting a sliding or rolling seal in the second penetration nozzle are disclosed.

11 Claims, 12 Drawing Figures

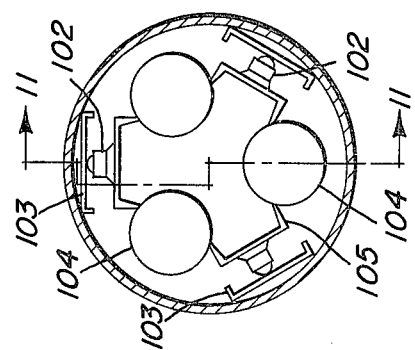
Fig. 12
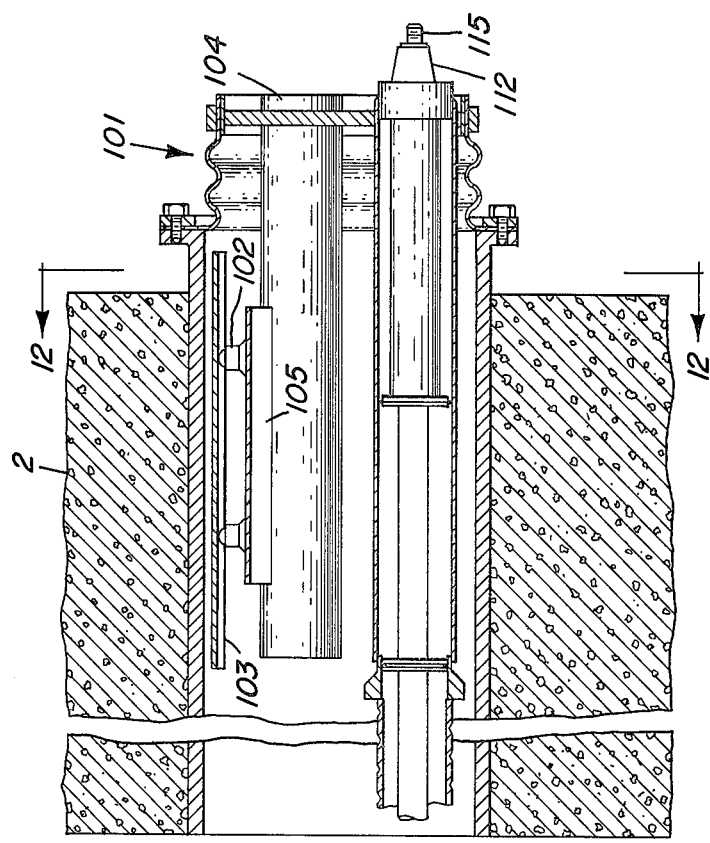
Fig. 11
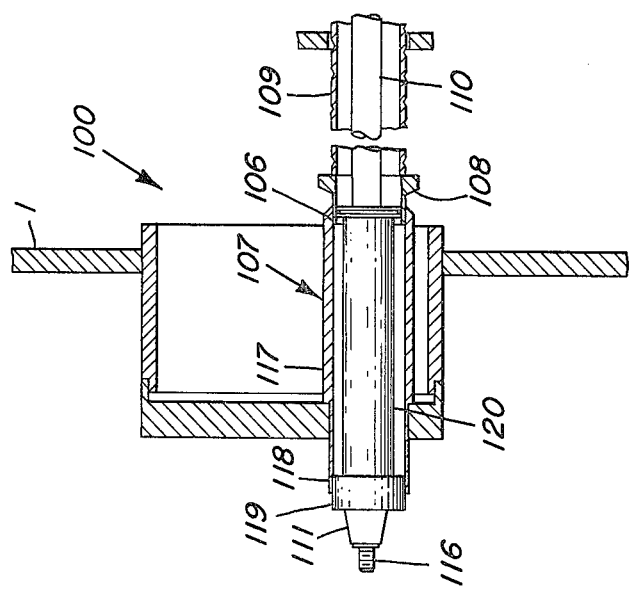

ELECTRICAL PENETRATION ASSEMBLY

BACKGROUND OF THE INVENTION

1. Field of the Invention

The invention is directed to an electrical penetration assembly for effecting a vapor and pressure seal for a conductor passing through the two freestanding walls of a nuclear reactor containment that are subject to relative movement due to a seismic event or thermal expansion of the walls and the conductor.

2. Background of the Invention

In most types of nuclear reactors, the reactor core is contained in a reactor vessel constructed of steel. The reactor vessel is housed in a containment building, or vessel, which is designed as a pressure vessel constructed from walls of concrete and steel. The containment vessel provides biological shielding and is pressure sealed to prevent the escape of vapors, liquids and other reactor materials in the event of leakage in the primary system. For the operation of the reactor, it is necessary to pass a variety of electrical conductors including power lines and control signal lines through the walls of the containment vessel.

In one type of containment vessel, two freestanding walls, one of concrete and one of steel are used to surround the nuclear reactor. The inside wall is normally referred to as the containment wall and the outside wall is normally referred to as the shield wall. The containment and shield walls are generally separated by an annulus of varying width. Conductors that must pass through the containment vessel are fixed to the walls of the containment vessel in penetration assemblies which are mounted in penetration nozzles built into the walls of the containment vessel during their initial fabrication. The freestanding walls of the containment vessel will move independently when subjected to motion due to a seismic event or due to a temperature variation between the walls or the walls and the conductor. This motion can cause damage to the conductor or the penetration assembly and this could allow the escape of vapors and other reactor materials in the event of a primary system leak.

Another problem encountered when installing electrical penetrations in a containment vessel having two spaced freestanding walls in that penetration nozzles built into each wall may not be in exact alignment. With low power conductors or signal conductors, this is not a serious problem due to the flexibility of the conductors. However, with medium and high power conductors, which are relatively stiff, misalignment of the penetration nozzles will cause an undesirable loading of the conductors or their protective covering when they are forced into place in a pair of misaligned penetration nozzles.

A variety of electrical penetration assemblies have been proposed and used. Among their deficiencies they are relatively expensive and complicated, they require undesirable maintenance during the life of the reactor plant, and they require an undue amount of costly on-site assembly and installation time. Some prior art electrical penetration assemblies have included provisions for minimizing damage to the electrical penetration assembly due to the relatively slow and gradual type of movement associated with thermal expansion of the conductors. However, these prior art electrical penetration assemblies have all been designed to pass through a single wall and the prior art does not present a solution to the problem of how to compensate for the relatively quick and violent relative movements of two freestanding walls due to a seismic event.

It is therefore the principal object of the invention to provide an electrical penetration assembly for two freestanding walls which prevents damage to either the conductor or the penetration assembly during a seismic event.

It is another object of the invention to provide an electrical penetration assembly which prevents damage to either the conductor or the penetration assembly due to thermally induced stresses resulting from the expansion of the conductor or the relative movement of the walls.

It is another object of the invention to provide an electrical penetration assembly for two freestanding walls which minimizes installation difficulties resulting from unavoidable misalignments of the walls or the penetration nozzles mounted therein.

It is another object of the invention to provide an electrical penetration assembly with a simplified modular construction.

It is another object of the invention to provide an electrical penetration assembly having two pressure barriers in series.

It is another object of the invention to provide an electrical penetration assembly which maintains sealing integrity throughout the plant lifetime with a minimum of maintenance.

SUMMARY OF THE INVENTION

Briefly stated, these and other objects of the invention are carried out, in one form of the invention, by providing an electrical penetration assembly for passing at least one conductor through the two freestanding walls of a containment vessel that comprises a first penetration subassembly fixed and sealed to the first wall and a second penetration subassembly in sliding or rolling engagement and sealed to the second wall. The first penetration subassembly is mounted in a first tubular penetration nozzle which is sealed in the first wall during the initial fabrication of the wall. The first penetration subassembly includes a first header sealed to one end of the first penetration nozzle, the first header having at least one first aperture therein with at least one first module in the first aperture. The second penetration subassembly is mounted in a second tubular penetration nozzle sealed in the second wall during the initial fabrication in the wall. The second penetration subassembly includes a second header sealed to one end of the second penetration nozzle, the second header having at least one second aperture and having at least one second module sealed in the second aperture. The first and second modules are elongated tubular bodies having one or more electrical conductors extending therethrough with an epoxy resin filling a space between the conductor and the tubular body to provide a vapor and pressure seal between the conductor and the tubular body. The second penetration subassembly includes means for providing relative movement by sliding or rolling between the conductor and the second penetration nozzle which allows the unrestrained reaction of the conductor to relative movements between the first and second walls resulting from a seismic event or temperature variation between the walls, or the conductor and the walls. The means for providing relative movement between the conductor and the second penetration nozzle also serves to minimize installation difficulties resulting from unavoidable misalignments between the walls and/or the penetration nozzles.

In one embodiment of the invention, the aperture in the second header comprises a cylindrical bore for receiving the second module. A plurality of resilient O-rings mounted in annular grooves in the second module are compressed between the second module and the inner diameter of the cylindrical bore of the second header to provide a piston and ring type sliding seal.

In another embodiment of the invention the modules are sealed in the second header and the second header is sealed to the second penetration nozzle with a flexible bellows. A plurality of rollers mounted on the second module engage the inner diameter of the second penetration nozzle and the rollers together with a flexible bellows provide a flexible rolling seal between the conductor and the second penetration nozzle.

DESCRIPTION OF THE DRAWINGS

FIG. 11 is a sectional view of another embodiment of the invention.

FIG. 12 is a sectional view taken along line 12—12 of the embodiment of the invention illustrated in FIG. 11.

DESCRIPTION OF THE PREFERRED EMBODIMENTS

Figure 1:
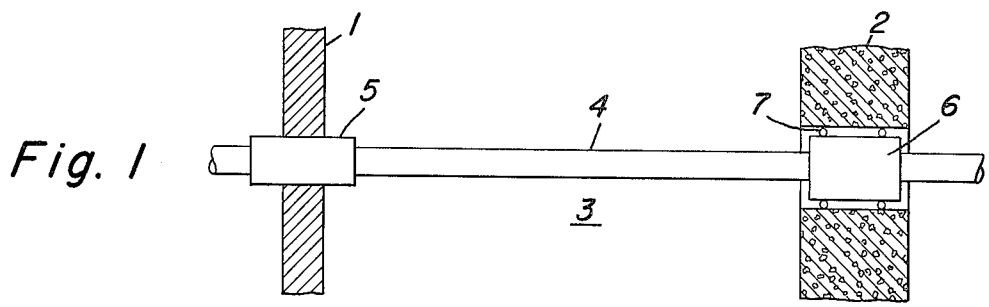
FIG. 1 is a schematic representation of an electrical penetration assembly constructed according to the invention.

Referring to FIG. 1 a schematic representation of an electrical penetration assembly constructed according to the invention is illustrated. A portion of a containment vessel is shown comprising two freestanding walls 1 and 2. The wall 1 is fabricated from plate steel ¾ to 1 inch in thickness and is normally referred to as the containment wall. The containment wall 1 is designed to contain a pressure of 103 psig in the event of leakage of the primary system. The wall 2 is fabricated with reinforced concrete normally about three feet in thickness and is normally referred to as the shield wall. The shield wall 2 is designed to contain a pressure of one-fourth inch of water in the event of leakage of the primary system. The walls 1 and 2 are separated by an annulus 3 of varying width which is usually about five feet. According to the invention a conductor 4 which penetrates both the containment wall 1 and the shield wall 2 is fixed and sealed to the containment wall 1 in a first penetration subassembly 5 and is in sliding or rolling engagement and sealed to the shield wall 2 in a second penetration subassembly 6. The second penetration subassembly 6 includes means for accommodating relative movement between the conductor 4 and the shield wall 2 here schematically represented as rollers 7, or the like, engaging the shield wall to allow the unrestrained reaction of the conductor to relative movements between the walls or the walls and the conductor.

Figure 2:
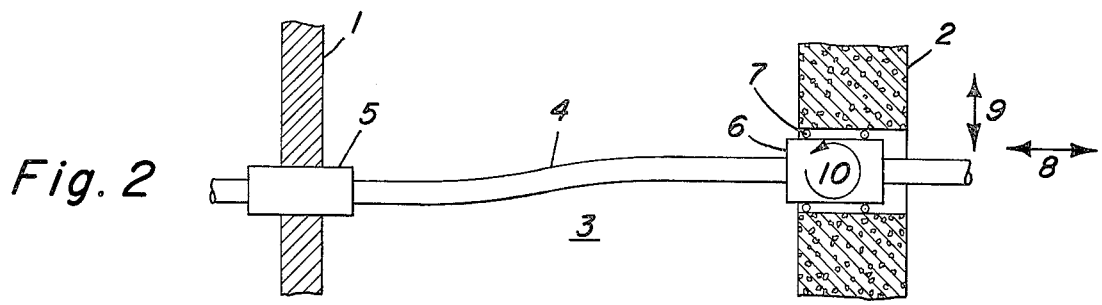
FIG. 2 is a schematic representation of the reaction of an electrical penetration assembly constructed according to the invention to relative movement of the two walls of the containment vessel.

Referring now to FIG. 2 the reaction of the penetration assembly to relative movement between the walls 1 and 2 or the walls and the conductor 4 is illustrated. Movement of the walls with respect to each other or with respect to the conductor may occur during a seismic event, or due to differences in temperature between walls 1 and 2, or the walls and the conductor 4. The electrical penetration assembly constructed according to the invention is primarily intended to solve problems associated with the relatively quick and violent relative movement of the walls 1 and 2 that occur due to a seismic event. However, the penetration assembly constructed according to the invention also reduces installation difficulties and solves problems associated with the relatively slow type of relative movement between the walls and the conductor resulting from thermal expansion of the walls and the conductor. Relative movements between the walls or between the walls and the conductor may be reduced to orthogonal displacements represented by horizontal and vertical arrows 8 and 9, respectively.

Movement in the horizontal direction, illustrated by the arrow 8, is accommodated by relative movement of the conductor 4 with respect to the shield wall 2. Tensile loading of the conductor 4 or any portion of the penetration assembly due to a horizontal movement is thereby reduced to the small amount of force required to overcome friction in the sliding or rolling seal provided by the second penetration subassembly 6.

Movement in a direction orthogonal to the conductor such as the vertical direction, illustrated by the arrow 9, is accommodated by the sliding or rolling of the conductor 4 with respect to the shield wall 2 and by a small moment illustrated by the arrow 10. The moment 10 is distributed over the length of the conductor 4 extending across the annulus 3 resulting in the deflection of the conductor as illustrated. Tensile loading of the conductor 4 or any portion of the penetration assembly due to a movement orthogonal to the conductor is thereby reduced to the small and insignificant amount of force required to overcome friction in the sliding or rolling seal, provided by the second penetration subassembly 6, and the small and insignificant moment 10.

Having thus reduced forces on the conductor to small and insignificant levels, the electrical penetration assembly constructed according to the invention allows the unrestrained reaction of the conductor to relative movements between the two freestanding walls of the containment vessel or between the walls and the conductor due to seismic events or thermally induced stresses.

The first and second penetration subassemblies are prefabricated for a predetermined penetration diameter and a predetermined width of the annulus 3. Construction techniques produce variations in the width of the annulus 3 and the location of the first and second penetration subassemblies that have made the installation of prior art penetration assemblies difficult. With small very flexible cables these problems can be minimized by simply providing a slack length of cable which extends across the annulus 3. However, with larger stiff cables the inevitable result of unavoidable built-in misalignments is an initial tensile loading of the conductor spanning the annulus 3 which has a deleterious effect on the conductor, the conductor insulation and the seals of both penetration subassemblies. With a penetration assembly constructed according to the invention variations in the width of the annulus 3 and/or misalignments between the location of the first penetration subassembly 5 and the second penetration subassembly 6 may be reduced to horizontal and vertical displacements illustrated by the arrows 8 and 9, and the small moment illustrated by the arrow 10. Any forces on the conductor 4 or the penetration assembly due to unavoidable misalignments of the penetration subassemblies or the walls of the containment vessel are thereby reduced to the level of the small and insignificant force required to overcome friction in the sliding or rolling seal, or to a small and insignificant moment distributed along the length of the conductor 4 spanning the annulus 3. Thus, an electrical penetration assembly constructed according to the invention greatly reduces the difficulty of installing an electrical penetration where the annulus 3 is of varying width and the subassemblies 5 and 6 in the walls of the annulus have unadvoidable misalignments.

Figure 3:
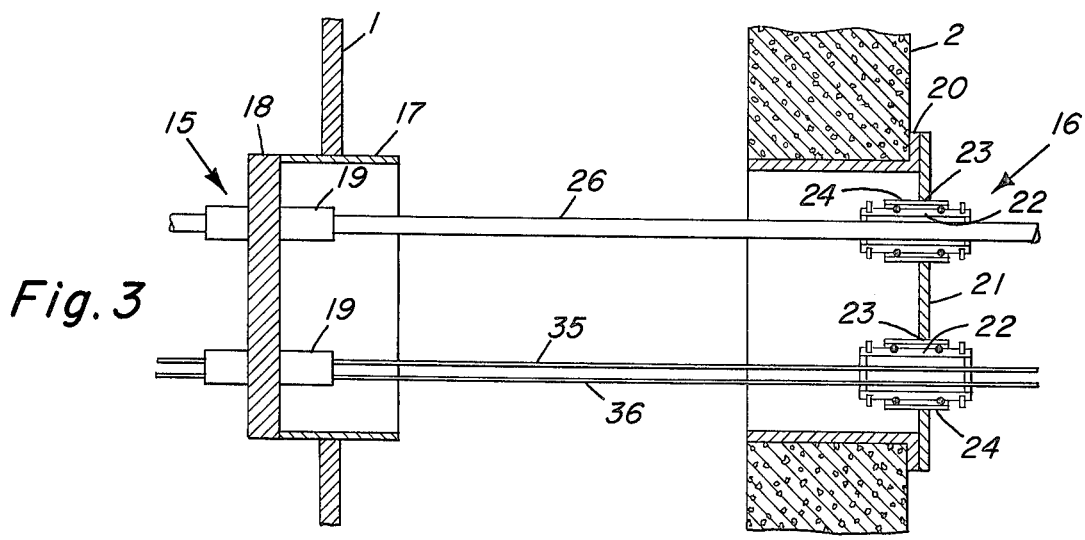
FIG. 3 is a sectional view of one embodiment of the invention.

Referring now to FIG. 3 a detailed embodiment of the invention is illustrated. The embodiment of the invention illustrated in FIG. 3 is particularly suited for medium, or low voltage cables. Medium voltage cables will carry less than 5,000 volts through the penetration assembly. The penetration assembly illustrated in FIG. 3 will accommodate at least one single conductor of up to No. 4/0 AWG in size or at least one cluster of small cables. The electrical penetration assembly constructed according to the invention is comprised generally of a first penetration subassembly 15 fixed to and in sealing relationship with the containment wall 1 and a second penetration assembly 16 in sliding engagement and sealed to the shield wall 2. The first penetration subassembly 15 is mounted in a penetration nozzle 17 which is built into the containment wall 1 during the initial fabrication of the wall. The penetration nozzle 17 may be welded to the wall 1 or bolted to the wall 1 with a plurality of bolts extending through a flange provided on the penetration nozzle. A typical penetration nozzle 17 is formed from steel pipe of 8 to 18 inches in diameter and up to 12 feet long depending on the thickness of the wall which is to be penetrated. The first penetration subassembly further includes a header 18 welded or bolted to one end of the penetration nozzle 17. The header 18 includes a plurality of modules 19 mounted by either welding or bolts in apertures provided in the header. The second penetration subassembly 16 is mounted in a second penetration nozzle 20 by either welding or bolts and includes a second header 21 with a plurality of second modules 22 mounted in sliding and sealing engagement in apertures 23 in header 21. The apertures 23 here include short sections of pipe 24 extending through and welded to the header 21, such that a cylindrical bore is provided for receiving the second modules 22. In cases where the header 21 is made of a thicker material, the sections of pipe 24 may be omitted and the apertures themselves will serve as cylindrical bores for receiving the second modules.

Figure 4:
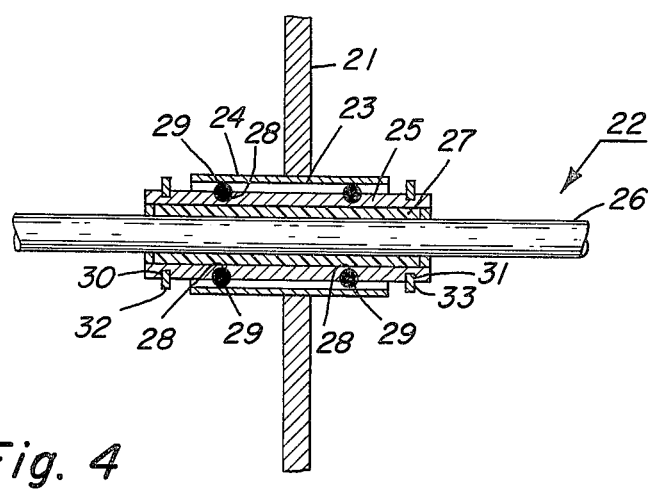
FIG. 4 is an enlarged sectional view of a sliding seal provided in the embodiment of the invention illustrated in FIG. 3.

The first modules 19 and the second modules 22 are of similar construction and are best illustrated by FIG. 4 which is an enlarged sectional view of one of the modules 22. The modules 19 and 22 are both comprised of an elongated tubular body 25 with at least one electrical conductor 26 extending therethrough. A means for providing a vapor and pressure seal between the tubular body 25 and the conductor 26 is comprised of an epoxy resin 27 which fills an annular space between the conductor 26 and the tubular body 25. A suitable method of constructing the first and second modules is explained in detail in U.S. Pat. No. 3,781,453 to Funk et al.

The modules 22 further include a plurality of annular grooves 28 having O-rings 29 mounted therein. The O-rings 29 are compressed between the second modules 22 and the inner diameter of the cylindrical bores 23 to provide a piston ring type sliding seal between the second modules 22 and the header 21. Thus, the unrestrained reaction of the conductor 26 to relative movement of the walls 1 and 2, or movement of the walls with respect to the conductor 26 is allowed.

The modules 22 extend outside both ends of the aperture 23 and further include annular grooves 30 and 31 at opposite ends of the module 22 outside of the aperture 23. Snap rings 32 and 33 are mounted in annular grooves 30 and 31, respectively, to act as stops to retain the modules 22 in the apertures 23.

Referring now to FIG. 3 it is illustrated that a pair of modules 19 and 22 may cooperate to pass a single large conductor 26 through the corresponding apertures in first and second headers of the penetration assembly. The modules 19 and 22 may also cooperate to pass a plurality of smaller conductors illustrated at 35 and 36 through the corresponding apertures of first and second headers of the penetration assembly. An epoxy resin is used to seal the conductors within the elongated tubular bodies of the modules 19 and 22 when a plurality of conductors are passed through each module.

Figure 5:
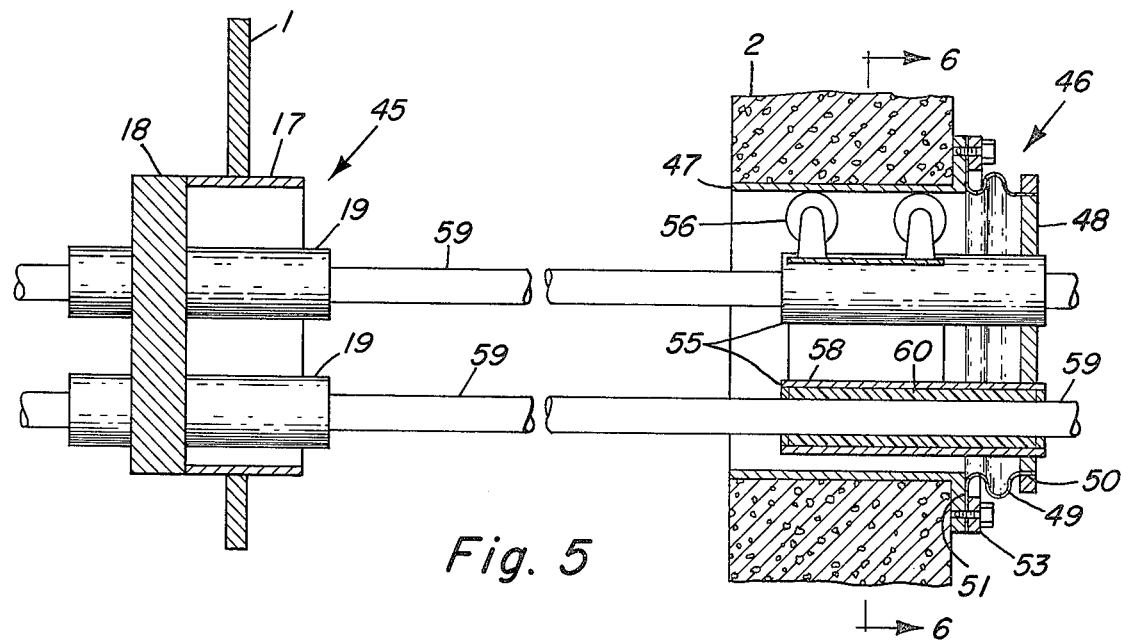
FIG. 5 is a sectional view of another embodiment of the invention.
Figure 6:
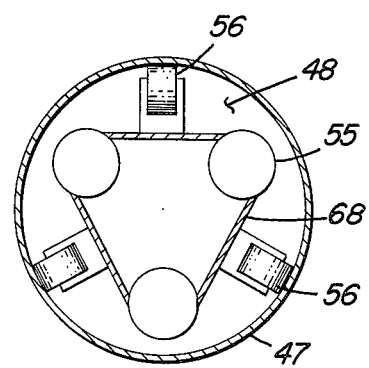
FIG. 6 is a sectional view taken along the line 6—6 of FIG. 5.

Referring now to FIGS. 5 and 6 another embodiment of the invention is illustrated. The embodiment of the invention illustrated in FIGS. 5 and 6 is particularly suited for medium or high voltage, shielded or unshielded cables of up to 1000 MCM in size. In FIG. 5 the first penetration subassembly 45 is mounted in a penetration nozzle mounted in the containment wall 1 in the manner previously described. Components corresponding to those in the first penetration subassembly shown in FIG. 3 are given the same numeral designations in FIG. 5. In FIG. 5 an arrangement for constructing a rolling seal in the second penetration subassembly is provided. The rolling seal illustrated in FIG. 5 is particularly suited for forming an electrical penetration for large diameter conductors which carry medium or high voltages through the penetration assembly.

According to the embodiment of the invention illustrated in FIG. 5 a second penetration subassembly 46 is provided in rolling engagement and sealed to the shield wall 2. The second penetration subassembly includes a second penetration nozzle 47 mounted in the shield wall 2 during the initial fabrication of the wall. In the present embodiment it is desirable for the penetration nozzle 47 to extend through the shield wall 2 to provide a steel liner for the second penetration subassembly to roll on. A second header 48 is sealed to the penetration nozzle 47 by means of a flexible bellows 49. One end 50 of the flexible bellows 49 is sealed to the header 48 by suitable means such as an annular clamp. The opposite end 51 of the flexible bellows 49 is sealed to a flange on one end of the penetration nozzle 47 or to the surface of the containment wall 2 in any suitable manner such as by a clamping ring 53 and a plurality of bolts. A suitable material for the bellows 49 is nylon impregnated with rubber or some other synthetic polymer such as that known by the trade name Hypalon. A plurality of second modules 55 are welded or bolted in apertures in the header 48. The second modules 55 include a plurality of rollers 56 engaging the inner diameter of the second penetration nozzle 47. The flexible bellows 49 and the rollers 56 provide a rolling seal with the shield wall 2 which allows the unrestrained reaction of the conductors passing through the modules 55 to relative movements between the walls 1 and 2 and the walls and the conductors 59.

The first and second modules employed in the embodiment of the invention illustrated in FIGS. 5 and 6 are similar to those illustrated in FIGS. 3 and 4. Each of the first and second modules comprises an elongated tubular body 58 having one or more conductors 59 passing therethrough with an epoxy resin in an annular space 60 between the hollow body 58 and the conductor 59.

Figure 7:
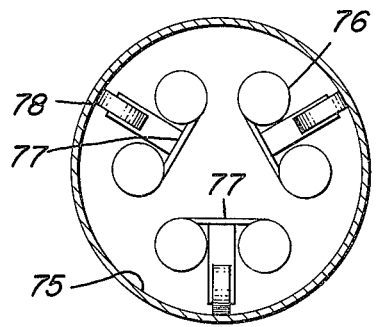
FIG. 7 is a sectional view of an embodiment of the invention having a sliding seal similar to the one illustrated in FIGS. 5 and 6 but accommodating a large number of smaller diameter conductors.

The embodiment shown in FIGS. 5 and 6 is designed to accommodate three cables. In some cases it may be desirable to pass a larger number of smaller cables through the same diameter penetration nozzles. FIG. 7 shows a modification of the embodiment of FIGS. 5 and 6 for accommodating six cables. In general, the number of modules that can be accommodated in a given penetration assembly depends on the diameter of the headers and the magnitude of the voltage and current carried by the conductors.

FIGS. 5 and 6 are specifically illustrative of an arrangement for accommodating a plurality of high voltage cables. High voltage cables are shielded power cables which carry more than 5,000 volts through the penetration assembly. Referring specifically to FIG. 6 three high voltage cable modules 55 are mounted on header 48 with their center lines on a circle which is concentric with the center line of the penetration nozzle 47. The modules 55 are interconnected by support plates 68 which are welded to the modules 55. Rollers 56 engaging the inner diameter of the penetration nozzle 47 are supported by the support plates 68.

Referring now to FIG. 7 a penetration nozzle 75 is illustrated that is the same diameter as the nozzle 47 of FIG. 6 but which is constructed to accommodate a plurality of medium voltage cables. Medium voltage cables are unshielded power cables that carry a voltage less than 5,000 volts through the penetration assembly. As illustrated in FIG. 7 the same diameter nozzle may carry a greater number of medium voltage modules 76 than the high voltage penetration assembly illustrated in FIG. 6. The modules 76 are arranged with their center lines on a circle which is concentric with the center line of the penetration nozzle 75. Support plates 77 are welded to pairs of medium voltage cable carrying modules 76. Each support plate 77 has a plurality of rollers 78 supported thereby which engage the inner diameter of the penetration nozzle 75.

Figure 8:
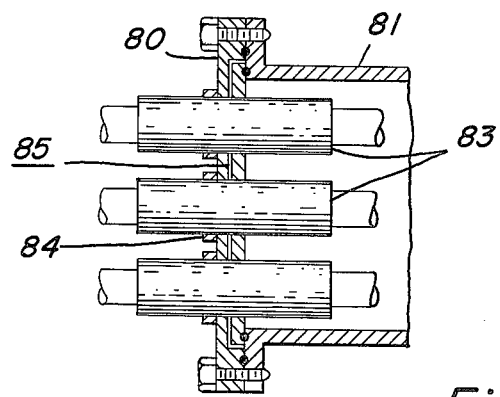
FIG. 8 is a sectional view of an alternate arrangement for attaching the penetration subassemblies to the walls of the containment vessel so that they may be pressure tested for leaks.

Referring now to FIG. 8 an alternate arrangement for attaching the first and second modules to the headers of the first and second penetration subassemblies, respectively, is illustrated. The mounting arrangement illustrated in FIG. 8 includes a header 80 which is bolted to a hollow penetration nozzle 81. The header 80 includes a plurality of apertures having a plurality of modules 83 mounted therein. The modules 83 in this case include flanges 84 which are fixed to the header 80 in any suitable manner such as by bolts or clamps. The header 80 includes passages 85 for effecting a pressure test of the seal between the modules 83 and the header 80. This arrangement for attaching the modules 83 to the header 80 is particularly useful where it may be desirable to provide for the disassembly or interchangeability of the modules in the penetration assembly. This method of mounting the modules 83 to the header of a penetration subassembly is applicable to the modules of the first or second penetration subassembly and is explained in detail in U.S. Pat. No. 3,781,453 to Funk et al.

Figure 10:
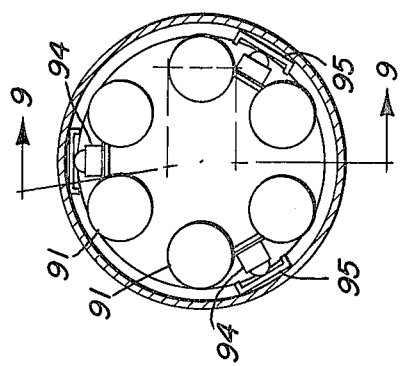
FIG. 10 is a sectional view taken along line 10—10 of the embodiment of the invention illustrated in FIG. 9.
Figure 9:
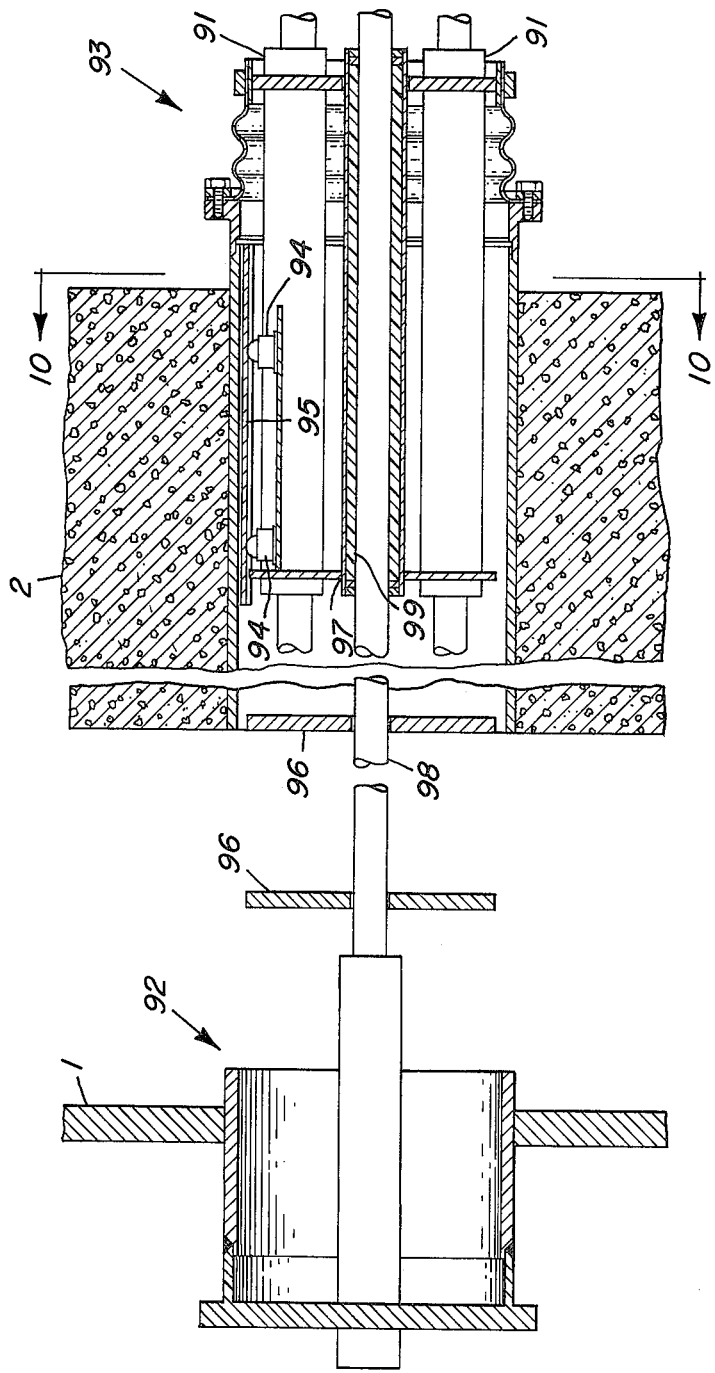
FIG. 9 is a sectional view of another embodiment of the invention.

Referring now to FIGS. 9 and 10 another embodiment of the invention employing ball bearing casters rather than rollers is illustrated. The embodiment of the invention shown in FIGS. 9 and 10 is designed to pass six medium voltage power cable modules 91. The first penetration subassembly 92 is mounted in the containment wall 1 in the manner previously described. The second penetration subassembly 93 is constructed like the second penetration subassembly of FIG. 5 with the exception that a plurality of ball bearing casters 94 engaging the inner diameter of the second penetration nozzle are here provided rather than the rollers illustrated in FIG. 5. A plurality of longitudinally arranged channels 95 are welded to the inner diameter of the second penetration nozzle to provide running races for the ball bearing casters 94. A plurality of cable supports 96 axially spaced along the conductors spanning the annular gap between the containment and shield walls may also be provided. The supports 96 are connected only to the conductors and serve to maintain spacing between the conductors spanning the annular gap between the containment and shield walls. The medium voltage cable modules of FIGS. 9 and 10 are constructed like those previously described from elongated tubular bodies 97 having a conductor 98 passing therethrough and a sealing epoxy resin 99 disposed in the space between the tubular body and the conductor.

Referring now to FIGS. 11 and 12 a high voltage shielded penetration assembly using ball bearing casters is illustrated. The first penetration subassembly 100 is mounted in the containment wall in the manner previously described. The second penetration subassembly 101 employs ball bearing casters 102 and longitudinally arranged channels 103 similar to those employed by the embodiment illustrated in FIG. 9. The high voltage electrical penetration assembly accommodates three high voltage cable modules 104 disposed in a circular array concentric with the penetration noozles. The high voltage cable modules 104 are interconnected by support members 105 having a plurality of ball bearing casters 102 mounted thereto. The high voltage cable modules differ from those previously discussed in that one end of the modules, such as the end 106 of the module 107, is provided with a coupling 108 which is welded and pressure sealed to a shielding flexible metal tube 109. The flexible metal tube 109 extends across the width of the annulus to pressure seal and shield the length of the conductor extending across the annulus. The space between the conductor and the flexible metal hose 109 may be pressurized for effecting a pressure test of the seals provided by the first and second modules of the first and second penetration subassemblies. The conductors 110 passing through the high voltage cable modules are terminated in bushings 111 and 112 with threaded ends 116 and 115, respectively, so that cable connectors may be connected thereto.

The high voltage modules of FIGS. 11 and 12 of which module 107 is typical are comprised of an elongated tubular housing 117 which is welded on one end 118 to a mounting ring 119 of bushing 111. The bushing 111 is connected to the conductor 110 in any suitable manner such as by a crimp connection which is encapsulated within a second elongated tubular conductive member 120. The tubular conductive member 120 which contains the connection between the bushing 111 and the conductor 110 is filled with an encapsulating epoxy resin or an insulating synthetic rubber. The high voltage modules are mounted in headers of the first and second penetration subassemblies by welds or bolts in the manner previously described.

The modular construction of each of the embodiments herein greatly reduces the amount of on-site fabrication and assembly time. During the construction of the containment vessel first and second penetration nozzles associated with the containment wall and shield wall, respectively, are built into the walls during their initial fabrication. The penetration assembly comprising first and second penetration subassemblies associated with the containment and shield walls, respectively, can be completely prefabricated for predetermined penetration nozzle diameter with a predetermined distance between nozzles and quickly assemblied at the site by simply welding, or bolting the two subassemblies to adjacent penetration nozzles. The penetration assembly disclosed provides two seals in series that require little or no maintenance over the lifetime of the plant and may include provisions for monitoring the seals during the lifetime of the plant.

Other modifications of the invention will occur to those skilled in the art and it is desired to cover in the appended claims all of such modifications as fall within the scope of the invention.

What is claimed as new and desired to be secured by Letters Patent of the United States is:

1. In a containment vessel having first and second spaced walls, said walls being subject to movement relative to one another, a penetration assembly to allow at least one electrical conductor to penetrate said containment vessel while maintaining the pressure and vapor integrity of the vessel, said penetration assembly including a first penetration subassembly fixed and sealed to said first wall comprising: a first tubular penetration nozzle sealed in said first wall, a first header sealed to one end of said first nozzle and having at least one first aperture, at least one first module sealed in said first aperture in said first header; and a second penetration subassembly in sliding engagement with and sealed to said second wall comprising: a second tubular penetration nozzle sealed in said second wall, a second header sealed to one end of said second nozzle and having at least one second aperture, at least one second module sealed in said second aperture, said first module and said second module each comprising a tubular body, at least one electrical conductor extending through said body and means for providing a vapor and pressure seal between said tubular body and said conductor, and said second penetration subassembly including means for accommodating relative movement between said conductor and said second wall to allow the unrestrained reaction of said conductor to relative movements between said first and second walls.

2. The electrical penetration assembly of claim 1 wherein said means for providing a vapor and pressure seal between said tubular body and said conductor comprises an epoxy resin filling an annular space between said tubular body and said conductor.

3. The electrical penetration assembly of claim 1 wherein said second module is formed with a plurality of annular grooves around its outer circumference, a plurality of resilient sealing rings mounted in said annular grooves in said second module, said sealing rings being compressed between said second module and the inner diameter of said second aperture to provide a piston ring type sliding seal for accommodating relative movement between said second module and said second wall.

4. The electrical penetration assembly of claim 3 wherein said resilient sealing rings are O-rings compressed in said annular grooves between said second module and said second aperture.

5. The electrical penetration assembly of claim 3 wherein said second module extends outside both ends of said second aperture and further includes annular grooves on opposite ends of said second module outside of said second aperture, and snap rings mounted in said annular grooves, said snap rings acting as stops to retain said second module in said second aperture.

6. The electrical penetration assembly of claim 1 wherein said means for accommodating relative movement between said conductor and said second wall comprises: a flexible bellows sealing said second header to one end of said second nozzle, and a plurality of rollers connected to said second module and engaging the inner diameter of said second nozzle.

7. The electrical penetration assembly of claim 1 wherein said means for providing relative movement between said conductor and said second wall comprises: a flexible bellows sealing said second header to one end of said second nozzle, and a plurality of ball bearing casters connected to said second module and engaging the inner diameter of said second nozzle.

8. The electrical penetration assembly of claim 7 further including a plurality of elongated channels mounted longitudinally on the inner diameter of said second penetration nozzle to provide running races for said ball bearing casters.

9. The electrical penetration assembly of claim 7 wherein a plurality of second modules are provided arranged in a circular array of pairs of said second modules in said circular array are connected by support plates each having a plurality of said ball bearing casters secured thereto.

10. The electrical penetration assembly of claim 7 wherein a plurality of said second modules are provided in a circular array and said second modules are connected by support plates each having a plurality of said ball bearing casters secured thereto.

11. The electrical penetration assembly of claim 7 further including a flexible tubular shield surrounding a length of said conductor extending between said first and second walls, said flexible tubular shield being sealed to said first and second modules whereby said first and second modules may be pressure tested and monitored for leaks.

* * * * *